United States Patent
Masuda

(10) Patent No.: US 8,952,496 B2
(45) Date of Patent: Feb. 10, 2015

(54) SEMICONDUCTOR WAFER AND METHOD OF PRODUCING SAME

(71) Applicant: Sumco Corporation, Tokyo (JP)

(72) Inventor: Sumihisa Masuda, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 14/290,287

(22) Filed: May 29, 2014

(65) Prior Publication Data
US 2014/0264765 A1 Sep. 18, 2014

Related U.S. Application Data

(62) Division of application No. 13/514,691, filed as application No. PCT/JP2010/007237 on Dec. 13, 2010, now Pat. No. 8,772,177.

(30) Foreign Application Priority Data

Dec. 24, 2009 (JP) ................. 2009-291912

(51) Int. Cl.
*H01L 29/06* (2006.01)
*H01L 29/30* (2006.01)

(52) U.S. Cl.
CPC ............ *H01L 29/0657* (2013.01); *H01L 29/30* (2013.01)
USPC ................... 257/618; 257/E21.237; 438/759; 451/66

(58) Field of Classification Search
CPC ........................... H01L 29/0657; H01L 29/30
USPC ............ 257/618, E21.237; 438/759; 451/54, 451/66, 158
See application file for complete search history.

(56) References Cited

U.S. PATENT DOCUMENTS

| | | | |
|---|---|---|---|
| 6,051,498 A * | 4/2000 | Pietsch et al. ................. | 438/691 |
| 6,583,029 B2 | 6/2003 | Abe et al. | |
| 7,250,368 B2 | 7/2007 | Kida et al. | |
| 7,507,146 B2 | 3/2009 | Kato et al. | |

(Continued)

FOREIGN PATENT DOCUMENTS

| DE | 102004054566 A1 | 5/2006 |
|---|---|---|
| DE | 102006044367 A1 | 4/2008 |

(Continued)

OTHER PUBLICATIONS

International Search Report for PCT/JP2010/007237 issued Mar. 15, 2011.

(Continued)

*Primary Examiner* — Allan R Wilson
(74) *Attorney, Agent, or Firm* — Thomas J. Engellenner; Reza Mollaaghababa; Pepper Hamilton LLP

(57) ABSTRACT

A wafer surface of a semiconductor wafer to be used as a device active region is mirror-polished, and an outer peripheral portion of the mirror-polished wafer surface is further polished, thereby forming an edge roll-off region between the device active region of the wafer surface and a beveled portion formed at the wafer edge. The edge roll-off region has a specific roll-off shape corresponding to an edge roll-off of the oxide film to be formed in a device fabrication process. Thus, a semiconductor wafer can be provided in which reduction in the thickness of an oxide film on the outer peripheral portion of the wafer in a CMP process can be prevented while maintaining high flatness of the wafer surface.

2 Claims, 9 Drawing Sheets

(56) References Cited

U.S. PATENT DOCUMENTS

| | | | |
|---|---|---|---|
| 8,242,020 B2* | 8/2012 | Roettger et al. | 438/693 |
| 8,409,992 B2* | 4/2013 | Moeckel et al. | 438/691 |
| 2003/0153251 A1 | 8/2003 | Mizushima | |
| 2005/0142882 A1* | 6/2005 | Kida et al. | 438/692 |
| 2007/0021042 A1* | 1/2007 | Schmolke et al. | 451/170 |
| 2008/0026185 A1 | 1/2008 | Mizushima | |
| 2008/0096474 A1 | 4/2008 | Kato et al. | |
| 2010/0056027 A1* | 3/2010 | Zapilko et al. | 451/57 |

FOREIGN PATENT DOCUMENTS

| | | | |
|---|---|---|---|
| EP | 0857542 A1 | 8/1998 | |
| JP | 2000235941 A | 8/2000 | |
| JP | 2002043257 A | 2/2002 | |
| JP | 2004241723 A | 8/2004 | |
| JP | 2007042748 A | 2/2007 | |
| JP | 2009081186 A | 4/2009 | |
| WO | 0196065 A1 | 12/2001 | |
| WO | 2010016510 A1 | 2/2010 | |
| WO | 2011077661 A1 | 6/2011 | |

OTHER PUBLICATIONS

Korean Office Action in Applicant's corresponding patent application No. 10-2012-7019365, dated Feb. 27, 2014.

* cited by examiner (a)

(b)

(a)

(b)

(c)

(a)

(b)

(a)

(b)

(a)

(b)

(c)

(a)

(b)

(c)

(a)

(b)

Roll-off Start point

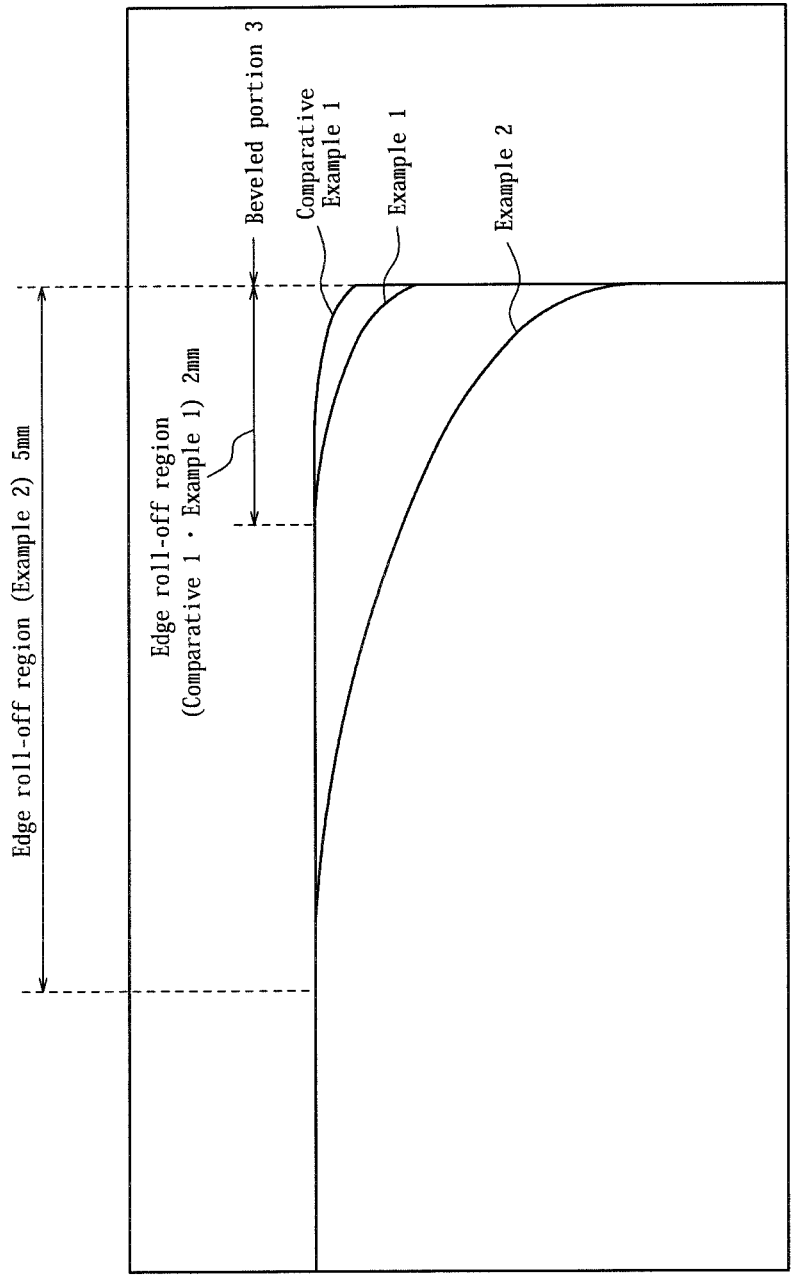

SEMICONDUCTOR WAFER AND METHOD OF PRODUCING SAME

CROSS-REFERENCE TO RELATED APPLICATIONS

The present application is a divisional of U.S. patent application Ser. No. 13/514,691, filed on Jun. 8, 2012, which is the national stage under 35 U.S.C. 371 of PCT Application No. PCT/JP2010/007237, filed Dec. 13, 2010, which claims the benefit of Japanese Patent Application No. 2009-291912, filed Dec. 24, 2009, all of which are incorporated by reference herein in their entireties.

TECHNICAL FIELD

The present invention relates to a method of producing a semiconductor wafer and to a semiconductor wafer. The present invention relates in particular to a semiconductor wafer which has high flatness except at the outer peripheral portion of the wafer and in which, when a thin oxide film is formed on a surface of the wafer in a device fabrication process, the oxide film on the outer peripheral portion of the wafer can be prevented from peeling off, and to a method of producing the same.

RELATED ART

As the integration degree of semiconductor devices has been significantly improved recently, the width of lines forming the semiconductor devices has become smaller. For production of such semiconductor devices using a stepper, the surface of the semiconductor wafers to be exposed is required to be very flat.

Conventionally, SFQR to be described later has been used as a measure of flatness to evaluate semiconductor wafers considering the converging effect of a stepper on the whole part of the semiconductor wafer surface.

As a method of producing a semiconductor wafer for improving the SFQR, a technique for improving SFQR by defining the relation between the thickness of a carrier and the thickness of a semiconductor wafer before being polished, and ensuring specific machining allowance based on the relation in a polishing process using a double-side polishing apparatus, is proposed (see Patent Document 1, for example).

Further, a technique that can improve SFQR by defining the relation between the thickness of a carrier and the thickness of a semiconductor wafer before being polished and performing a plurality of polishing processes under different conditions in a polishing process using a double-side polishing apparatus, is proposed (see Patent Document 2, for example).

Given these circumstances, as mirror polishing techniques have been developed, wafers with almost the whole wafer surface being highly planarized have come to be produced in recent years. Today, in device fabrication processes, wafers with an SFQR of 50 nm or less on the edge exclusion region (a surface on which a device is to be formed (main surface) extending from the wafer center position to a position 2 mm inward from the edge position) have been demanded. Companies are competing with each other to develop wafers that are highly planarized in a uniform manner to the outer peripheral portion as possible.

In a device fabrication process, after a thin oxide film is formed on a wafer surface, the surface of the formed oxide film is generally mirror-polished by chemical mechanical polishing (CMP). However, it has become evident that when a wafer highly planarized to achieve an SFQR of 50 nm or less on a 2-mm edge exclusion region is used in a device fabrication process, the oxide film on an outer peripheral portion of wafers is peeled off in some cases. Such peeling off of an oxide film on the outer peripheral portion of a wafer is not preferable because it would be a factor of affecting the yield of devices.

Such a phenomenon is considered to occur, for example because significantly soft polishing cloth is used in CMP performed in a device fabrication process, which would lead to a large amount of roll-off at the surface of the outer peripheral portion of a wafer. When a silicon wafer highly planarized to the outer periphery is used, the thickness of the oxide film on the outer peripheral portion becomes locally thin (peripheral sagging) due to CMP process and the locally thinned portion of the oxide film may tend to easily peel off from the wafer. The roll-off amount of an oxide film subjected to a typical CMP process is expressed as 200 nm or more in ESFQRmax to be described below.

Therefore, the inventor of the present invention thought of producing a wafer of which outer peripheral portion is rolled off purposefully in advance taking into consideration the roll-off amount in a CMP process of a device fabrication process, thereby preventing reduction in the thickness of an oxide film on an outer peripheral portion of a wafer in the CMP process.

Based on the above technical ideas, the inventor first made studies on producing wafers with the outer peripheral portion greatly rolled off in a rough polishing process performed to control the flatness of the wafer surface. Then, he found that when a mirror polishing process is performed on a wafer such that its outer peripheral portion is greatly rolled off in a rough polishing process, SFQR of the wafer surface except for the outer peripheral portion drops significantly (as also described in paragraph [0027] of Patent Document 2). To the contrary, it was revealed that when a mirror polishing process is performed to improve flatness of the wafer surface except for the outer peripheral portion, the roll-off amount of the outer peripheral portion of the wafer drops.

The present invention has been completed based on technical ideas completely different from the conventional to roll off an outer peripheral portion of a wafer purposefully. An object of the present invention is to provide a wafer having increased roll-off amount at the outer peripheral portion while maintaining high flatness of the wafer surface. The present invention is aimed at achieving the above object by purposefully mirror polishing the surface of only the outer peripheral portion of the wafer having been mirror polished.

PRIOR ART DOCUMENT

Patent Document

Patent Document 1: JP 2000-235941 A
Patent Document 2: JP 2009-81186 A

DISCLOSURE OF THE INVENTION

Problems to be Solved by the Invention

An object of the present invention made focusing on those aspects is to provide a semiconductor wafer making it possible to increase the roll-off amount at the outer peripheral portion to prevent the peeling off of an oxide film on the outer peripheral portion of the wafer due to reduction in the thickness of the oxide film in a CMP process of a device fabrication process while high flatness of the wafer surface is maintained, and to provide a method of producing the same.

Means for Solving the Problem

In order to achieve the above object, in an invention of a method of producing a semiconductor wafer, a semiconductor wafer has a mirror-polished main surface and an edge portion beveled and polished, and the method comprises the step of performing a first polishing process of polishing only an outer peripheral portion of the main surface to form an edge roll-off region.

Further, the edge roll-off region is preferably a region obtained by polishing the outer peripheral portion of the main surface extending outward from a predetermined position within 10 mm inward from an edge position of the wafer.

Furthermore, in a preferred embodiment of the present invention, the first polishing process can be performed using a ring-shaped polishing cloth having a size corresponding to the outer peripheral portion of the main surface.

The method preferably further comprises, after the first polishing process, the step of forming an oxide film on the main surface and performing a second polishing process of mirror polishing a surface of the oxide film, and in performing the first polishing process, a roll-off amount of the edge roll-off region is preferably determined to approximate a roll-off amount of the oxide film surface after the second polishing process.

A semiconductor wafer of another invention for achieving the above object includes a mirror-polished main surface, an edge portion beveled and polished, and an edge roll-off region located only at an outer peripheral portion of the main surface, wherein a flatness ESFQRmax of the main surface of the semiconductor wafer, including at least a part of the edge roll-off region is 200 nm or more, and a flatness SFQRmax of the main surface except for the edge roll-off region is 50 nm or less.

Preferably, the ESFQRmax is a value obtained by measurement from a position 1 mm inward from the edge position of the wafer toward the center of the wafer, and the SFQRmax is a value obtained by measurement from a position 2 mm inward from the edge position of the wafer toward the center of the wafer.

Note that the "roll-off amount" herein means a distance in the thickness direction between the outer edge of an edge roll-off region in a surface of a wafer or an oxide film and the outer edge of the flat surface without roll-off. The roll-off amount is positively correlated with ESFQRmax to be described later (when the flatness of the rear surface has the same conditions).

Effect of the Invention

According to the present invention, a main surface of a semiconductor wafer, which is used as a surface on which a device is to be formed (hereinafter also referred to as a device formation surface), is mirror polished, and then the outer peripheral portion of the main surface of the mirror-polished wafer is further polished, thereby forming an edge roll-off region between the main surface and the beveled portion formed at the wafer edge. Thus, reduction in the thickness of an oxide film on the outer peripheral portion of the wafer in a CMP process can be prevented while maintaining high flatness of the wafer surface.

BRIEF DESCRIPTION OF THE DRAWINGS

FIG. 2(a) is a cross-sectional view illustrating a case of using a wafer with high flatness, and FIG. 2(b) is a cross-sectional view illustrating a case of using a rolled-off wafer.

FIG. 4(a) is a cross-sectional view schematically illustrating an apparatus for polishing an outer peripheral portion, and FIG. 4(b) is a cross-sectional view including a ring-shaped polishing cloth and an edge portion of a semiconductor wafer.

FIG. 6(a) is a cross-sectional view including an end portion of the semiconductor wafer, and FIG. 6(b) and FIG. 6(c) are diagrams illustrating SFQRmax and ESFQRmax, respectively.

FIG. 7(a) is a cross-sectional view including an end portion of the semiconductor wafer, and FIG. 7(b) and FIG. 7(c) are diagrams illustrating SFQRmax and ESFQRmax, respectively.

FIG. 8(a) is a cross-sectional view schematically illustrating an apparatus for polishing an outer peripheral portion, and FIG. 8(b) is a cross-sectional view including a ring-shaped polishing cloth and an edge portion of a semiconductor wafer.

FIG. 9 is a cross-sectional view illustrating an end portion of semiconductor wafers according to Examples 1 and 2, and Comparative Example 1.

BEST MODE FOR CARRYING OUT THE INVENTION

Embodiments of the present invention will now be described with reference to the drawings.

Figure 1:
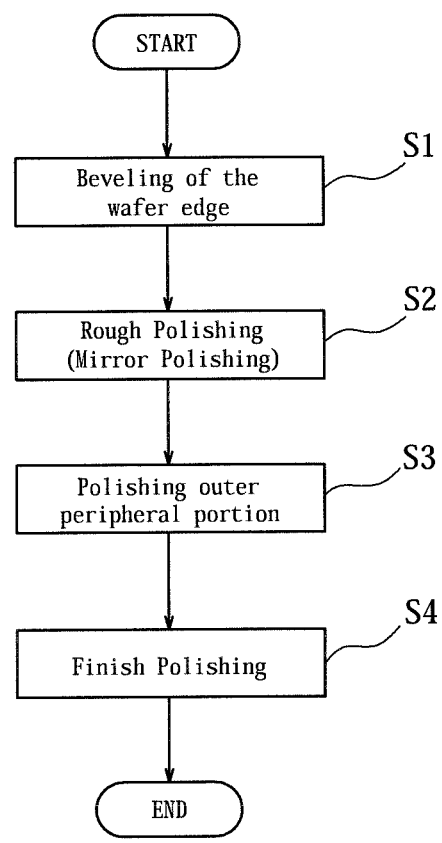
FIG. 1 is a flow diagram showing an embodiment of a method of producing a semiconductor wafer in accordance with the present invention.

FIG. 1 is a flow diagram illustrating one embodiment of a method of producing a semiconductor wafer in accordance with the present invention. First, a silicon single crystal ingot is sliced using a wire saw or the like to make semiconductor wafers. An edge portion of one of these semiconductor wafers obtained is beveled (step S1), and then rough polishing is performed (step S2). Rough polishing is a mirror polishing process for controlling the surface profile (flatness). For example, the both surfaces of the wafer are mirror-polished to be flat using a double-side polishing apparatus provided with a carrier setting the semiconductor wafer, and an upper plate and a lower plate for sandwiching the carrier therebetween.

Next, an outer-peripheral-portion polishing step is performed for polishing only an outer peripheral region of a main surface of the semiconductor wafer on which a device is to be formed, thereby faulting an edge roll-off region having a specified roll-off amount between the main surface and the beveled portion (step S3). This polishing of the outer peripheral portion is polishing of only the outer peripheral portion in an area within 10 mm, preferably within 5 mm, and more preferably 2 mm from the edge of the semiconductor wafer.

For example, the semiconductor wafer is set on a stage rotating about the center of the wafer as the rotation center. While rotating the semiconductor wafer, a polishing member is pressed against the outer peripheral portion to polish only the outer peripheral portion. The rotation of the semiconductor wafer allows the whole outer periphery of the wafer to be uniformly polished with a constant width. Further, the roll-off amount can be controlled by the pressure applied when the polishing member is pressed against the semiconductor wafer, and the polishing time.

After that, the semiconductor wafer is further finish-polished using a polishing apparatus (step S4). The finish polishing is a mirror polishing process performed for controlling the surface roughness such as haze and may be performed at least on the main surface.

The semiconductor wafer produced through the above steps can achieve a large roll-off amount at the outer peripheral portion of the wafer while maintaining high flatness of the wafer surface. Therefore, using this wafer, when an oxide film is formed on the surface thereof in a device fabrication process and the formed oxide film is mirror-polished by CMP, reduction in the thickness of the oxide film on the outer peripheral portion of the wafer can be prevented, which inhibits peeling off of the film. Consequently, the yield achieved in the device fabrication process can be improved.

Figure 2:
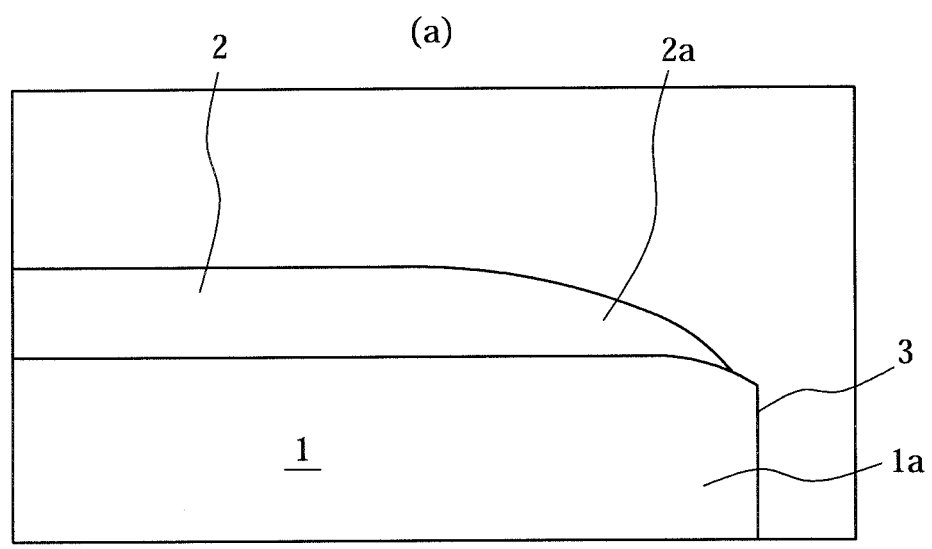
FIGS. 2(a) and 2(b) are cross-sectional views each showing an end portion of a semiconductor wafer having been subjected to polishing after an oxide film is formed on its surface.
Figure 2:
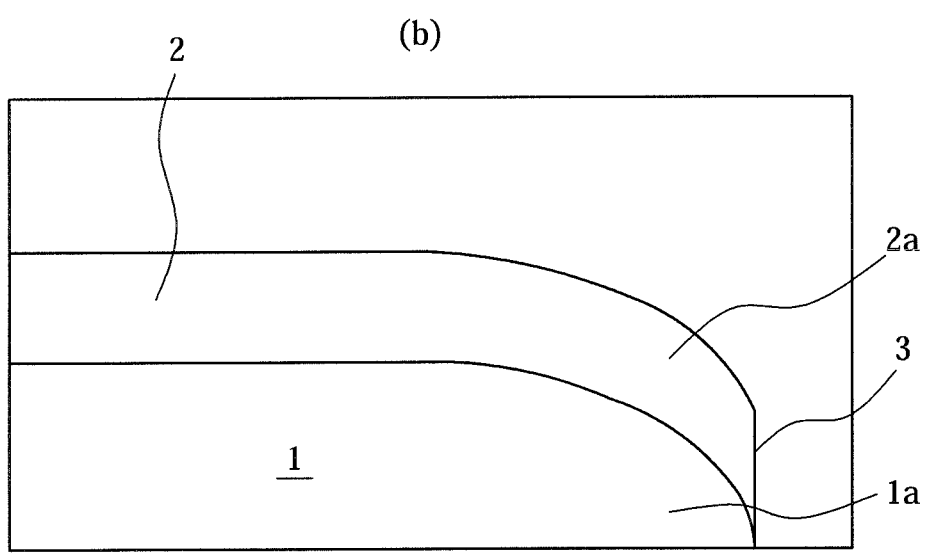

This will be described with reference to FIGS. 2(a) and 2(b). FIGS. 2(a) and 2(b) are cross-sectional views each showing an end portion of a semiconductor wafer having been subjected to polishing after an oxide film is formed on its surface. FIG. 2(a) is a cross-sectional view illustrating a case of using a wafer with high flatness without polishing the outer peripheral portion, and FIG. 2(b) is a case of rolling off the outer peripheral portion of a semiconductor wafer by polishing.

As shown in FIG. 2(a), a semiconductor wafer 1 with high flatness formed by mirror polishing has a narrow edge roll-off region 1a and a small roll-off amount. When an oxide film 2 is formed on this wafer 1 and polishing is performed by CMP in a device fabrication process, a roll-off 2a of the oxide film around the edge would result in the reduction of the thickness of the oxide film to cause peeling off of the film.

In contrast, when the outer peripheral portion of the semiconductor wafer 1 is rolled off as in FIG. 2(b), the semiconductor wafer 1 on which the oxide film 2 is formed is greatly rolled off at the edge portion. Therefore, even when the oxide film 2 is subjected to CMP, the thickness of the oxide film 2 on the outer peripheral portion is not reduced. In particular, when the roll-off amount of the semiconductor wafer 1 in the outer-peripheral-portion polishing step (step S3) is determined so as to be equivalent to the edge roll-off amount of the oxide film 2 having been processed by CMP in the device fabrication process, the thickness of the oxide film 2 can be almost uniform from the center to the edge, and peeling off of the oxide film can be reduced. Further, when the roll-off shape of the semiconductor wafer 1 in the outer-peripheral-portion polishing step (step S3) is determined so as to correspond to the roll-off shape of the oxide film 2 having been processed by CMP, a semiconductor wafer provided with the oxide film 2 having more uniform thickness after CMP can be obtained.

SFQR (Site Front Least Squares Range) here refers to a value obtained about each of the site, which is the sum of absolute values of maximum displacement amounts of both the positive side and the negative side from a reference plane in the site which is obtained by calculation of the data using a least square method in the prescribed site. The positive side means the upper side of the wafer horizontally placed with its main surface facing upward and the negative side means the lower side in the like manner. SFQRmax refers to a maximum value among SFQRs of all the sites on the wafer. The flatness SFQRmax defined in the present invention is a value obtained by measuring all the sites having a size of 26×8 mm$^2$ using a flatness measuring apparatus (WaferSight manufactured by KLA-Tencor).

ESFQR (Edge flatness metric, Sector based, Front surface referenced, least sQuares fit reference plane, Range of the data within sector) here means SFQR measured inside a fan-shaped region (sector) formed on the entire outer peripheral area of the wafer. ESFQRmax means a maximum value among ESFQRs of all the sectors on the wafer. ESFQRmean is a mean value of ESFQRs of all the sectors. ESFQR prescribed in the present invention is a value measured in a sector (site size) obtained by dividing the entire periphery of the wafer evenly into 72 sectors at 5° intervals, each of which has a sector length of 30 mm in the diameter direction, by means of a flatness measuring apparatus (Wafer Sight manufactured by KLA-Tencor corporation). Note that the edge exclusion region here is 1 mm.

Figure 3:
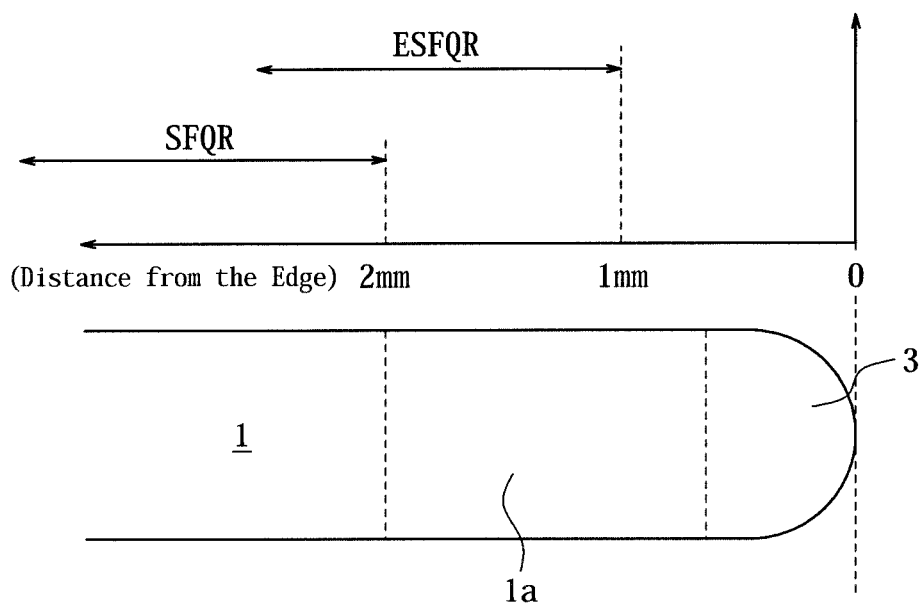
FIGS. 3(a) to 3(c) are diagrams illustrating ESFQR and SFQR.
Figure 3:
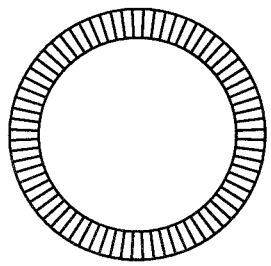
Figure 3:
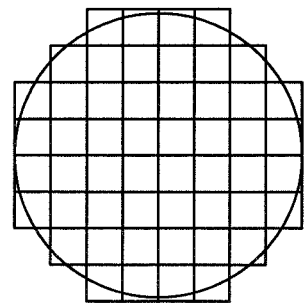

FIGS. 3(a) to 3(c) are diagrams illustrating SFQR and ESFQR. A region used for calculating the ESFQR of a 1-mm edge exclusion region is shown in FIGS. 3(a) and 3(b). A region used for calculating the SFQR of a 2-mm edge exclusion region is shown in FIGS. 3(a) and 3(c). FIG. 3(a) shows a cross-sectional view of a wafer and a diagram showing the area of the regions used for calculating ESFQR and SFQR corresponding to the cross-sectional view. FIGS. 3(b) and 3(c) are plan views showing the shape of the regions used for calculating ESFQR and SFQR, respectively. In FIGS. 3(a) to 3(c), the edge roll-off region 1a is formed in an area within 2 mm from the wafer edge. SFQRmax corresponds to the flatness of a device active region of the semiconductor wafer 1, whereas ESFQRmax corresponds to the flatness of the outer peripheral portion except for the beveled portion 3 (several hundreds μm from the edge) of the semiconductor wafer.

Note that, in cross-sectional views of a wafer, including FIGS. 2(a) and 2(b) and other figures, the edge roll-off region 1a is formed between the main surface on which a device is to be formed and the beveled portion 3 in the wafer. The beveled portion 3 extends in the diameter direction and the thickness direction of the wafer in a range of a several hundred micrometers order. Meanwhile, the edge roll-off region has a width of several millimeters order in the diameter direction and several tens of nanometers to several hundreds of nanometers order in the thickness direction. Therefore, the inclination of the beveled portion 3 with respect to the diameter direction of the wafer 1 is far greater than that of the edge roll-off region. Given this situation, in the cross-sectional views of the wafer 1, including FIGS. 2(a) and 2(b) and other figures, the wafer is significantly magnified in the thickness direction in order to show the edge roll-off region 1a. Accordingly, the beveled portion 3 is illustrated to be almost perpendicular to the direction of the thickness of the semiconductor wafer.

Example 1

Figure 4:
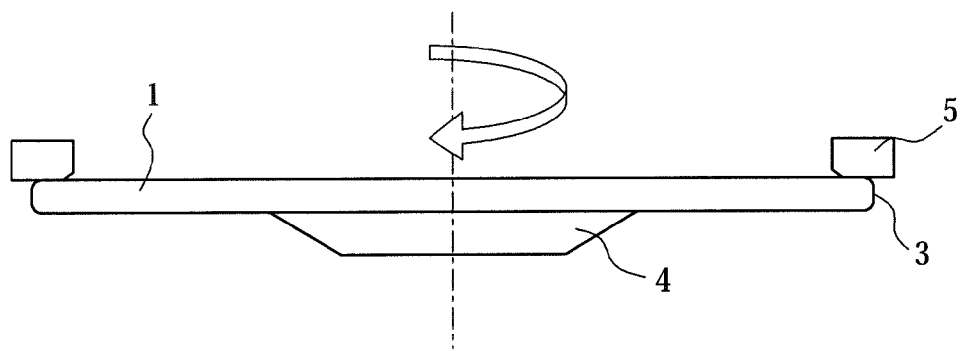
FIGS. 4(a) and 4(b) are diagrams illustrating a method of polishing an outer peripheral portion in Example 1.
Figure 4:
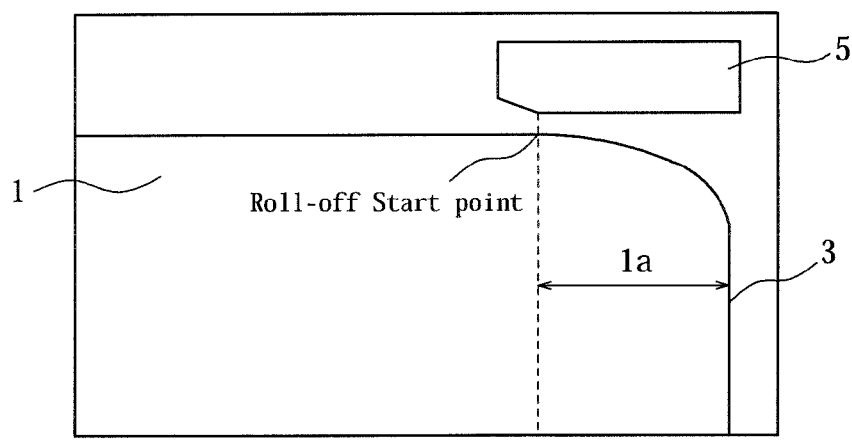

FIGS. 4(a) and 4(b) are diagrams illustrating a method of polishing an outer peripheral portion of a wafer in Example 1. FIG. 4(a) is a cross-sectional view schematically illustrating an apparatus for polishing an outer peripheral portion, and FIG. 4(b) is a cross-sectional view including a ring-shaped polishing cloth and an edge portion of a semiconductor wafer.

For polishing the outer peripheral portion of the semiconductor wafer 1, the apparatus in FIG. 4(a) includes a rotation stage 4 for holding the semiconductor wafer 1 and rotating it about the central axis, and a ring-shaped polishing cloth 5 for polishing only a region extending about 2 mm from the edge of the wafer 1. The ring-shaped polishing cloth 5 rotates in the direction opposite to the rotation direction of the wafer 1. Using the ring-shaped polishing cloth 5, the ring-shaped polishing cloth 5 can be uniformly pressed against the outer peripheral portion of the wafer, which prevents stress from being concentrated at a part of the wafer 1.

The both surfaces of the semiconductor wafer 1 having a diameter of 300 mm were mirror polished in a rough polishing step (step S2). The outer peripheral portion of the semiconductor wafer 1 was polished using the apparatus in an outer-peripheral-portion polishing step (step S3). The main surface to be used as a device formation surface was polished for 60 seconds with the use of an alkaline polishing agent containing colloidal silica as slurry.

Figure 5:
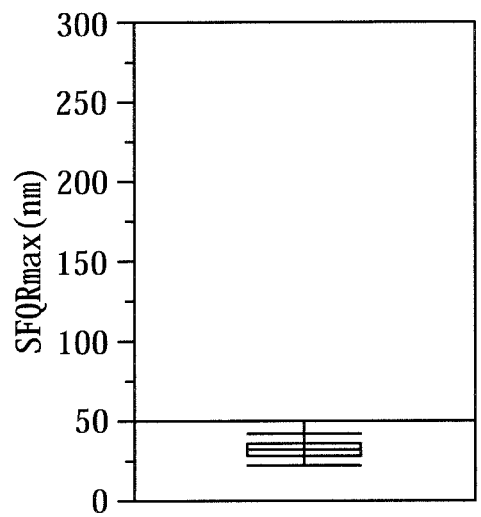
FIG. 5(a) is a plot showing the distribution of SFQRmax of the semiconductor wafer according to Example 1.
FIG. 5(b) is a plot showing the distribution of ESFQRmax of the semiconductor wafer according to Example 1.
Figure 5:
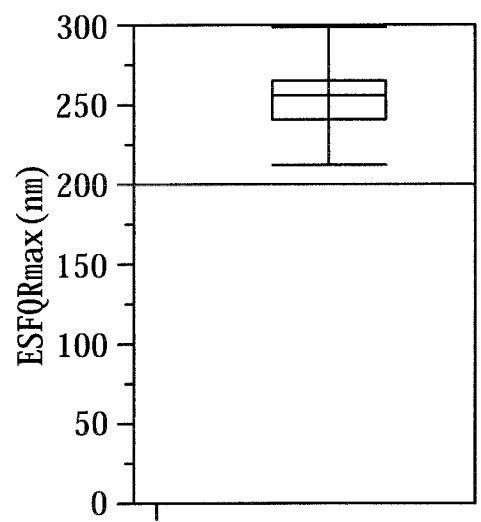

Thus, an edge roll-off region 1a was formed in a region extending 2 mm from the edge. The main surface inside the region was not subjected to the polishing in step S3, so that high flatness was maintained. FIGS. 5(a) and 5(b) are plots showing the distribution of SFQRmax and ESFQRmax of the semiconductor wafer 1 of Example 1, respectively. It is shown that semiconductor wafers having an SFQRmax of 50 nm or less with the 2-mm edge exclusion region and an ESFQRmax of 200 nm or more with the 1-mm edge exclusion region were produced. Note that FIGS. 5(a) and 5(b) are box plots showing the maximum value and the minimum value (the top and bottom horizontal lines), the 75% and 25% lines (the upper and lower ends of the box), and the median (the horizontal line inside the box) for data with respect to 40 samples.

Figure 6:
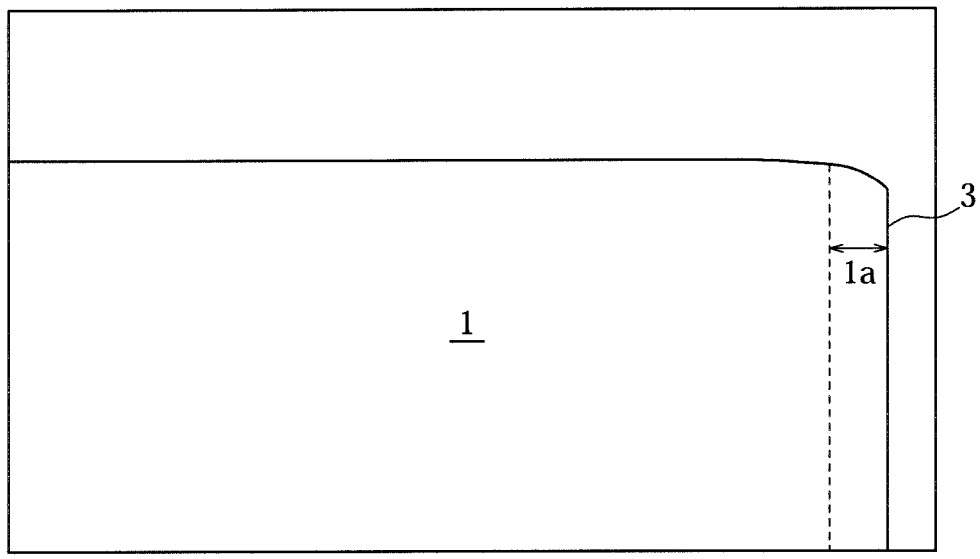
FIGS. 6(a) to 6(c) are diagrams illustrating the surface profile of a semiconductor wafer in accordance with Comparative Example 1.
Figure 6:
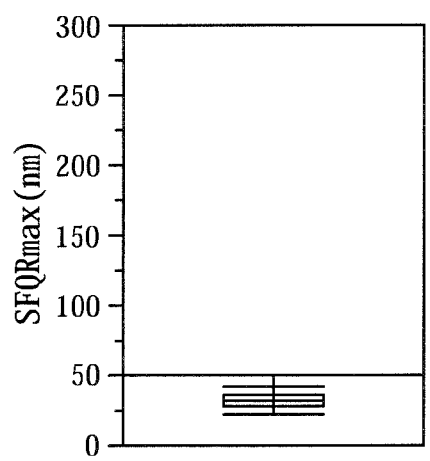
Figure 6:
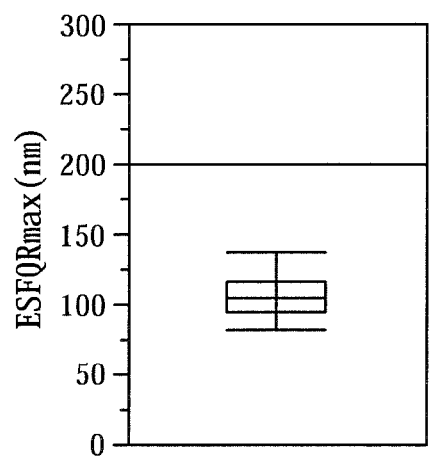

FIGS. 6(a) to 6(c) are diagrams illustrating the surface profile of a semiconductor wafer 1 in accordance with Comparative Example 1. FIG. 6(a) is a partial cross-sectional view including an end portion of the semiconductor wafer 1, and FIG. 6(b) and FIG. 6(c) are diagrams each illustrating SFQRmax and ESFQRmax, respectively. In this Comparative Example 1, a semiconductor wafer having a diameter of 300 mm was subjected to double-side polishing in the rough polishing step to be highly planarized. After that, finish polishing was performed without polishing the outer peripheral portion. Therefore, Comparative Example 1 is different from Example 1 in that the outer-peripheral-portion polishing step S3 was not performed.

Thus, the semiconductor wafer of Comparative Example 1 had high flatness from the center to the vicinity of the beveled region, so that the SFQRmax with the 2-mm edge exclusion region was 50 nm or less. On the other hand, the ESFQRmax with the 1-mm edge exclusion region was around 100 nm, which is considerably less than 200 nm. Therefore, when an oxide film is formed in a device fabrication process, the oxide film on the outer peripheral portion would be reduced due to the consequent small edge roll-off amount, which could result in peeling off of the film.

Figure 7:
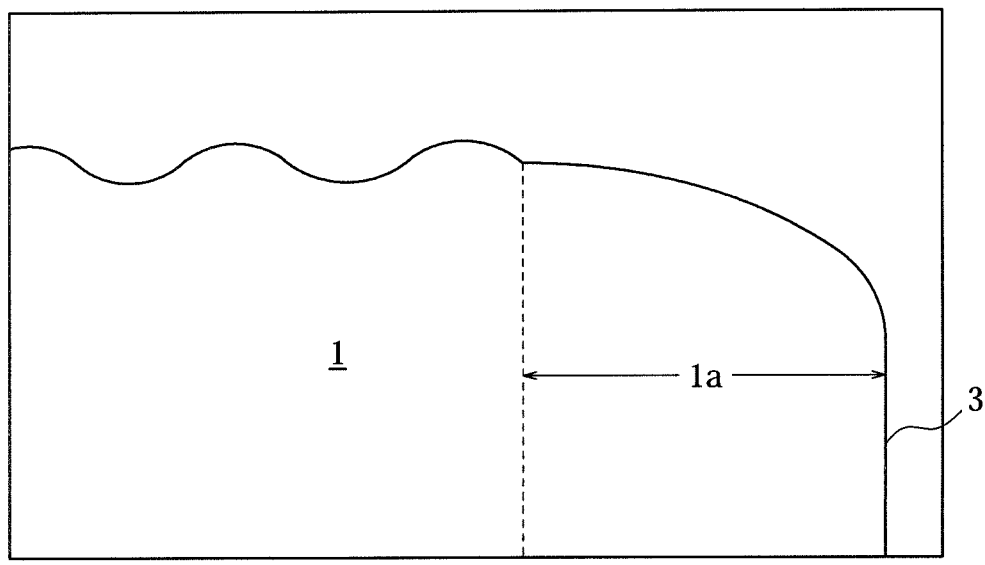
FIGS. 7(a) to 7(c) are diagrams illustrating the surface profile of a semiconductor wafer in accordance with Comparative Example 2.
Figure 7:
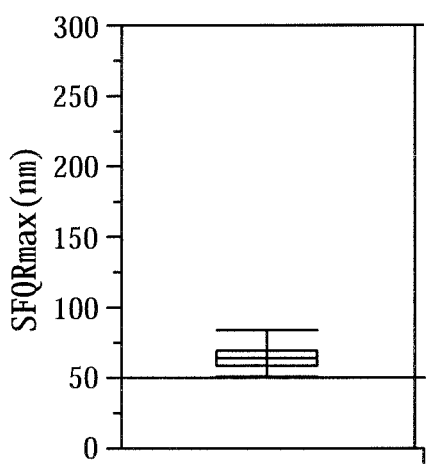
Figure 7:
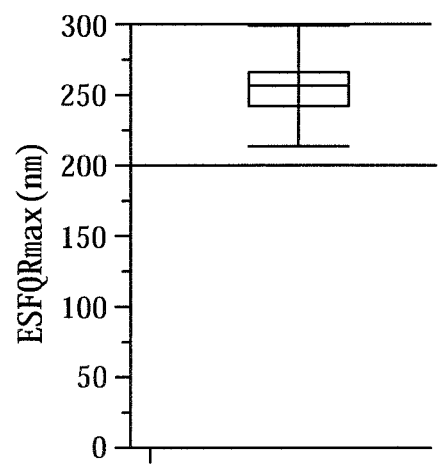

FIGS. 7(a) to 7(c) are diagrams illustrating the surface profile of a semiconductor wafer 1 in accordance with Comparative Example 2. FIG. 7(a) is a cross-sectional view including an end portion of the semiconductor wafer, and FIGS. 7(b) and 7(c) are diagrams each illustrating SFQRmax and ESFQRmax, respectively. In this Comparative Example 2, a semiconductor wafer having a diameter of 300 mm was polished such that the outer peripheral portion of the wafer was to be greatly edge-rolled off through a rough polishing process. Also in Comparative Example 2, finish polishing was performed without polishing the outer peripheral portion. Thus, this comparative example is aimed at achieving a large roll-off amount by controlling the polishing conditions of a conventional rough polishing process without additional polishing step of polishing the outer peripheral portion.

In this case, however, other area of the semiconductor wafer 1 except for the outer peripheral portion cannot have high flatness as shown in FIG. 7(a). As a result, the ESFQRmax with the 1-mm edge exclusion region was 200 nm or more, but the SFQRmax with the 2-mm edge exclusion region was also 50 nm or more, which reduces flatness of the main surface to be used as a device formation surface.

As described above, it was difficult to achieve an ESFQRmax of 200 nm or more while maintaining an SFQRmax of 50 nm or less in Comparative Examples 1 and 2. In other words, it was difficult to provide an edge roll-off region with a large roll-off amount while maintaining high flatness of the main surface on which a device would be formed. By contrast, these two conditions can be satisfied at the same time in Example 1. Thus, reduction in the yield due to peeling off of an oxide film was successfully prevented while satisfying requirements for high flatness of wafers for higher integration.

Since the edge roll-off region was formed in an area extending 2 mm from the edge in the semiconductor wafer according to Example 1, the conditions required in a device fabrication process can be satisfied: high flatness with an SFQRmax of 50 nm with a 2-mm edge exclusion region, and an ESFQRmax of 200 nm or more corresponding to the roll-off amount of a CMP process. Consequently, a semiconductor wafer having high flatness almost over the whole wafer surface, in which peeling off of an oxide film is less likely to occur after CMP in a device fabrication process can be provided.

Example 2

Figure 8:
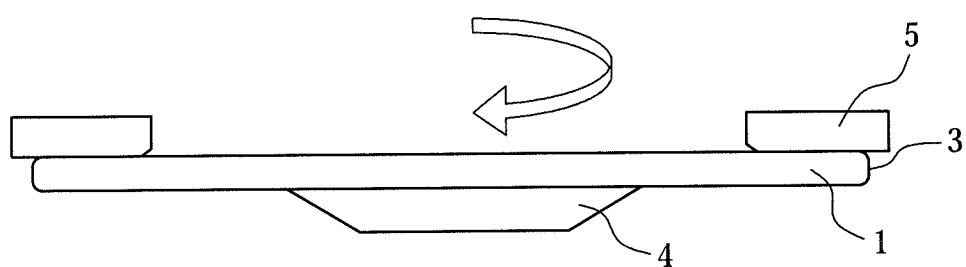
FIGS. 8(a) and 8(b) are diagrams illustrating a method of polishing an outer peripheral portion in Example 2.
Figure 8:
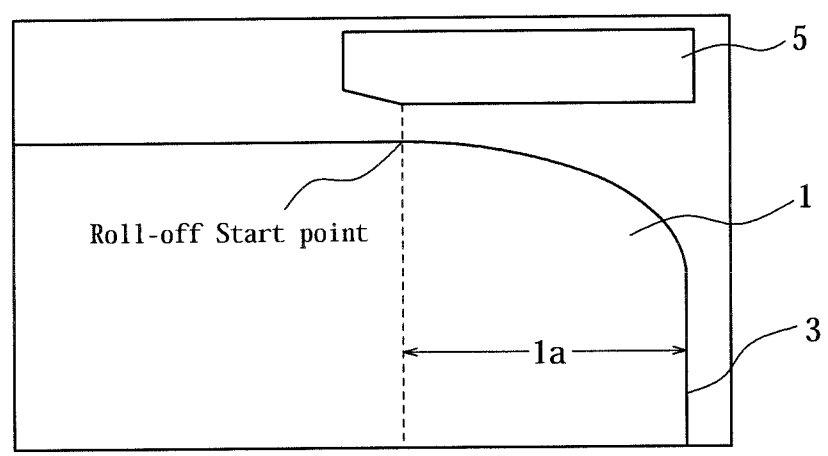

FIGS. 8(a) and 8(b) are diagrams illustrating a method of polishing an outer peripheral portion of a wafer 1 according to Example 2. FIG. 8(a) is a cross-sectional view schematically illustrating an apparatus for polishing an outer peripheral portion, and FIG. 8(b) is a cross-sectional view including a ring-shaped polishing cloth 5 and an edge portion of the semiconductor wafer 1. Example 2 is different from Example 1 in that a polishing cloth with which a region extending about 5 mm from the wafer edge can be polished was used as the ring-shaped polishing cloth 5, and the polishing time was 90 seconds which was longer than that in Example 1. The structure and the implementation steps other than the above are the same as Example 1, so the explanation will be omitted.

According to Example 2, the rolling off may start at a position about 5 mm distant from the edge of the semiconductor wafer 1 where the ring-shaped polishing cloth 5 contacts the semiconductor wafer 1 as shown in FIG. 8(b).

FIG. 9 is a cross-sectional view including the edge of semiconductor wafers produced in accordance with Examples 1 and 2, and Comparative Example 1. As mentioned above, the semiconductor wafer according to Example 1 has an edge roll-off region having a higher roll-off amount than the semiconductor wafer according to Comparative Example 1. However in FIG. 9, the width of the edge roll-off region in the radial direction in Example 1 is approximately the same as that in Comparative Example 1. On the other hand, the semiconductor wafer according to Example 2 has an edge roll-off region even wider in the radial direction and has a larger roll-off amount.

Thus, a desired size of the edge roll-off region 1a and a desired roll-off amount can be achieved by changing the polishing width and the polishing time with respect to the ring-shaped polishing cloth 5.

It is to be noted that the present invention is not limited only to the above embodiments and various changes and modifications can be made thereto. For example, double-side polishing was performed in the rough polishing step; alternatively, only the main surface to be used as a device formation surface may be polished. The outer peripheral portion of only the main surface on which a device would be formed was polished in the outer-peripheral-portion polishing step; however, the outer peripheral portion of the both surfaces of the semiconductor wafer may be polished. In addition, for a ring-shaped polishing cloth used for polishing the outer peripheral portion, the shape of the polishing cloth is not limited to a ring shape as long as the outer peripheral portion can be locally polished.

In Examples 1 and 2, an area extending 2 mm or 5 mm from the wafer edge was polished in the outer-peripheral-portion polishing step, but the width of the outer peripheral portion to be polished is not limited to these. When the area of the outer peripheral portion to be polished is within 10 mm from the wafer edge, the obtained wafer can have an adequately large device formation region even excluding the edge roll-off region.

INDUSTRIAL APPLICABILITY

According to the present invention, a main surface of a semiconductor wafer, which is used as a device active region, is mirror polished, and then the outer peripheral portion of the main surface of the mirror-polished wafer is further polished, thereby forming an edge roll-off region between the main surface of the wafer and the beveled portion formed at the wafer edge. Thus, reduction in the thickness of an oxide film on the outer peripheral portion of the wafer in a CMP process can be prevented while maintaining high flatness of the wafer surface.

EXPLANATION OF REFERENCE NUMERALS

1: Semiconductor wafer
1a: Edge roll-off region (wafer)
2: Oxide film
2a: Edge roll-off region (oxide film)
3: Beveled portion (edge position)
4: Rotation stage
5: Ring-shaped polishing cloth

The invention claimed is:

1. A semiconductor wafer comprising a mirror-polished main surface, an edge portion beveled and polished, and an edge roll-off region located only at an outer peripheral portion of the main surface,
   wherein a flatness ESFQRmax of the main surface of the semiconductor wafer, including at least a part of the edge roll-off region is 200 nm or more, and
   a flatness SFQRmax of the main surface except for the edge roll-off region is 50 nm or less.

2. The semiconductor wafer according to claim 1,
   wherein the ESFQRmax is a value obtained by measurement from a position 1 mm inward from the edge position of the wafer toward the center of the wafer, and
   the SFQRmax is a value obtained by measurement from a position 2 mm inward from the edge position of the wafer toward the center of the wafer.

* * * * *